United States Patent
Shen

(10) Patent No.: US 7,307,287 B2
(45) Date of Patent: Dec. 11, 2007

(54) LED PACKAGE AND METHOD FOR PRODUCING THE SAME

(76) Inventor: Yu-Nung Shen, No. 60, Lane 328, Li-Shan Street, Nei-Hu Dist., Taipei City (TW)

( * ) Notice: Subject to any disclaimer, the term of this patent is extended or adjusted under 35 U.S.C. 154(b) by 0 days.

(21) Appl. No.: 11/225,068

(22) Filed: Sep. 14, 2005

(65) Prior Publication Data
US 2006/0057751 A1 Mar. 16, 2006

(30) Foreign Application Priority Data
Sep. 15, 2004 (TW) .............................. 93127798 A

(51) Int. Cl.
*H01L 29/22* (2006.01)

(52) U.S. Cl. .................. 257/99; 257/100; 257/E33.055

(58) Field of Classification Search .................. 257/88, 257/99, 100; 438/28
See application file for complete search history.

(56) References Cited

U.S. PATENT DOCUMENTS 6,593,597 B2 * 7/2003 Sheu ........................... 257/94

* cited by examiner

*Primary Examiner*—B. William Baumeister
*Assistant Examiner*—Matthew L. Reames
(74) *Attorney, Agent, or Firm*—Rosenberg, Klein & Lee

(57) ABSTRACT

A method for producing an LED package is provided, the LED package includes an LED die, which has a light-emitting surface, a non-light-emitting surface opposite to the light-emitting surface, a first electrode and a second electrode arranged on the non-light-emitting surface, a reverse-voltage protection member arranged on the non-light-emitting surface of the LED die, a conductive member electrically connecting the respective electrode of the LED die and the respective pole of the reverse-voltage protection member, and two outer conductive members electrically connecting the selected electrode or pole to an exterior circuit. Wherein the reverse-voltage protection member has a first pole that is the first polarity and a second pole that is the second polarity; the polarity of each pole of the reverse-voltage protection member is opposite to that of the electrode of the LED die.

10 Claims, 10 Drawing Sheets

LED PACKAGE AND METHOD FOR PRODUCING THE SAME

BACKGROUND OF THE INVENTION

1. Field of the Invention

The present invention relates to an LED package and a method for producing the same.

2. Background of the Invention

Conventional LED packages are equipped with ESD (Electrostatic discharge) devices to protect the LED. However, the volume thereof is large and many users desire an LED package that is thinner and more lightweight.

SUMMARY OF THE INVENTION

An LED package is provided with a reverse-voltage protection device and is smaller in size.

A LED package with multiple dies and a method for producing the same are provided.

A method for producing an LED package is provided and comprises:
  providing an LED die that is illuminates when it is excited, wherein the LED die has a light-emitting surface, a non-light-emitting surface opposite to the light-emitting surface, a first electrode, which acts as a first polarity, arranged on the light-emitting surface and the non-light-emitting surface in an alternative manner, and a second electrode, which acts as a second polarity that is opposite to the first polarity, arranged on the light-emitting surface and the non-light-emitting surface in an alternative manner;
  arranging a reverse-voltage protection member on the non-light-emitting surface of the LED die, wherein the reverse-voltage protection member which has a first pole that is the first polarity and a second pole that is the second polarity;
  forming a conductive member electrically connecting at least one of the electrodes of the LED die and a respective one of the poles of the reverse-voltage protection member, wherein the polarity of each of the poles of the reverse-voltage protection member is opposite to that of the electrode of the LED die; and
  forming two outer conductive members that electrically connect the selected electrode or the pole to an exterior circuit.

A method for producing an LED package is provided and comprises:
  providing an LED die that illuminates when it is excited, wherein the LED die has a light-emitting surface, a non-light-emitting surface opposite to the light-emitting surface, a first electrode, which acts as a first polarity, arranged on the light-emitting surface and the non-light-emitting surface in an alternative manner, and a second electrode, which acts as a second polarity that is opposite to the first polarity, arranged on the light-emitting surface and the non-light-emitting surface in an alternative manner;
  arranging a reverse-voltage protection member on the non-light-emitting surface of the LED die, wherein the reverse-voltage protection member has a first pole area and a second pole area, aligned with the first and the second electrodes of the LED die respectively; the first pole area acts as the first polarity and the second pole area acts as the second polarity; both the first and the second pole areas have a through hole that exposes the respective electrode, whose polarity is opposite to the pole area; and
  forming two outer conductive members electrically connecting the electrodes to an exterior circuit.

A method for producing an LED package is provided and comprises:
  providing an LED die that is illuminates when it is excited, wherein the LED die has a light-emitting surface, a non-light-emitting surface opposite to the light-emitting surface, a first electrode, which acts as a first polarity, arranged on the light-emitting surface and the non-light-emitting surface in an alternative manner, and a second electrode, which acts as a second polarity that is opposite to the first polarity, arranged on the same surface as the first electrode;
  arranging a reverse-voltage protection member on the non-light-emitting surface of the LED die, wherein the reverse-voltage protection member is a capacitor, which includes two poles extending around the electrodes of the LED die respectively, and the two poles are opposite to each other;
  forming an insulative layer, on an electrode installation surface of the LED die, wherein the insulative layer is defined with two exposure holes by an exposing and developing process, the two through holes expose a respective one of the electrodes of the LED die and the respective pole of the reverse-voltage protection member extending around the electrode of the LED die;
  forming a conductive member that includes two conductors, for electrically connecting the respective electrodes of the LED die to the respective poles of the reverse-voltage protection member; wherein the two conductors are disposed inside the respective through holes for electrically connecting the respective electrodes of the LED die to the respective poles of the reverse-voltage protection member;
  forming an enclosing layer over the protective layer of the LED die, wherein the enclosing layer has two openings for exposing the conductors; and
  forming at least two outer conductive members electrically connecting the selected electrode or pole to an exterior circuit, wherein each of the two outer conductive members which are respectively a first conductive portion that is disposed inside the respective opening and electrically connects to the partial portion of the corresponding conductor, and a second conductive portion that electrically connects to the first conductive portion and protrudes outwardly from the respective opening.

A method for producing an LED package is provided and comprises:
  providing an LED die that illuminates when it is excited, wherein the LED die has a light-emitting surface, a non-light-emitting surface opposite to the light-emitting surface, a first electrode, which acts as a first polarity, arranged on the non-light-emitting surface, and a second electrode, which acts as a second polarity that is opposite to the first polarity, arranged on the non-light-emitting surface;
  forming a conductive member, which has a transparent conductive layer on the first electrode of the non-light-emitting surface of the LED die and an adjacent area near the first electrode;
  arranging an auxiliary LED die on the transparent conductive layer, wherein the an auxiliary LED die includes a first surface, a second surface opposite to the first surface, a first auxiliary electrode disposed on the first surface, and a second auxiliary electrode arranged on the second surface; wherein the auxiliary LED die is disposed on the transparent conductive layer while the second surface of the auxiliary LED die is arranged under the non-light-emitting surface, and faces the non-light-emitting surface of the LED die, so that the second auxiliary electrode of the auxiliary LED die electrically connects to the first electrode of the LED die via the conductive layer;

forming an opaque enclosing layer on the non-light-emitting surface of the LED die for covering the auxiliary LED die, wherein the enclosing layer has two openings exposing the second electrode of the LED die and the first auxiliary electrode of the auxiliary LED die; and disposing an outer conductive member inside each of the openings; wherein the outer conductive member includes a first conductive portion that is disposed inside the respective opening and electrically connects to the respective electrodes, and a second conductive portion that electrically connects to the first conductive portion and protrudes outwardly from the respective opening.

A method for producing an LED package is provided and comprises:

providing an LED die that illuminates when it is excited, wherein the LED die has a light-emitting surface, a non-light-emitting surface opposite to the light-emitting surface, a first electrode, which acts as a first polarity, arranged on the non-light-emitting surface, and a second electrode, which acts as a second polarity that is opposite to the first polarity, arranged on the non-light-emitting surface;

arranging an auxiliary LED die on the non-light-emitting surface of the ED die, wherein the auxiliary LED die which has a first pole that is the first polarity and a second pole that is the second polarity;

forming a conductive member electrically connecting at least one of the electrodes of the LED die and a respective one of the poles of the auxiliary LED die, wherein the polarity of the respective pole of the auxiliary LED die is the same as that of the electrode of the LED die; and forming two outer conductive members electrically connecting the selected electrode or the pole to an exterior circuit.

A method for producing an LED package is provided and comprises:

providing an LED die that illuminates when it is excited, wherein the LED die has a light-emitting surface, a non-light-emitting surface opposite to the light-emitting surface, a first electrode, which acts as a first polarity, arranged on the light-emitting surface and the non-light-emitting surface in an alternative manner, and a second electrode, which acts as a second polarity that is opposite to the first polarity, arranged on the light-emitting surface and the non-light-emitting surface in an alternative manner;

arranging an auxiliary LED die on the non-light-emitting surface of the LED die, wherein the auxiliary LED die has a first pole area and a second pole area aligned with the first and the second electrodes of the LED die respectively; the first pole area acts as the first polarity and the second pole area acts as the second polarity, both the first and the second pole area have a through hole that exposes the respective electrode, whose polarity is the same as the pole area; and forming at least two outer conductive members electrically connecting the electrodes to an exterior circuit, wherein each outer conductive member is a first conductive portion that electrically connects with the respective electrode of the LED die and the respective pole area of the auxiliary LED die, and a second conductive portion that electrically connects to the first conductive portion and protrudes outwardly from the respective opening.

An LED package is provided and comprises:

an LED die that illuminates when excited, wherein the LED die has a light-emitting surface, a non-light-emitting surface opposite to the light-emitting surface, a first electrode, which acts as a first polarity, arranged on the light-emitting surface and the non-light-emitting surface in an alternative manner, and a second electrode, which acts as a second polarity that is opposite to the first polarity, arranged on the light-emitting surface and the non-light-emitting surface in an alternative manner;

a reverse-voltage protection member arranged on the non-light-emitting surface of the LED die, wherein the reverse-voltage protection member has a first pole that is the first polarity and a second pole that is the second polarity;

a conductive member electrically connecting at least one of the electrodes of the LED die and a respective one of the poles of the reverse-voltage protection member, wherein the polarity of each pole of the reverse-voltage protection member is opposite to that of the electrode of the LED die; and two outer conductive members electrically connecting the selected electrode or pole to an exterior circuit.

An LED package is provided and comprises:

an LED die that illuminates when excited, wherein the LED die has a light-emitting surface, a non-light-emitting surface opposite to the light-emitting surface, a first electrode, which acts as a first polarity, arranged on the light-emitting surface and the non-light-emitting surface in an alternative manner, and a second electrode, which acts as a second polarity that is opposite to the first polarity, arranged on the light-emitting surface and the non-light-emitting surface in an alternative manner in an alternative manner;

a reverse-voltage protection member arranged on the non-light-emitting surface of the LED die, and having a first pole area and a second pole area aligned with the first and the second electrodes of the LED die respectively; the first pole area acts as the first polarity and the second pole area acts as the second polarity; both the first and the second pole area have a through hole that exposes the respective electrode, whose polarity is opposite to the pole area; and two outer conductive members electrically connecting the electrodes to an exterior circuit.

An LED package is provided and comprises:

an LED die that illuminates when excited, wherein the LED die has a light-emitting surface, a non-light-emitting surface opposite to the light-emitting surface, a first electrode, which acts as a first polarity, arranged on the light-emitting surface and the non-light-emitting surface, and a second electrode, which acts as a second polarity that is opposite to the first polarity, arranged on the selected surface that is arranged with the first electrode;

a reverse-voltage protection member arranged on the non-light-emitting surface of the LED die, wherein the reverse-voltage protection member is a capacitor, which includes two poles extending around the electrodes of the LED die respectively, and being opposite to each other;

an insulative layer formed on an electrode installation surface of the LED die, wherein the insulative layer is defined with two exposure holes by an exposing and developing process, the two through holes expose a respective one of the electrodes of the LED die and the respective pole of the reverse-voltage protection member extending around the electrode of the LED die;

a conductive member including two conductors, wherein the two conductors are disposed inside the respective through holes so that the respective electrodes of the LED die can be electrically connected to the respective poles of the reverse-voltage protection member;

an enclosing layer formed over the protective layer of the LED die, wherein the enclosing layer has two openings for exposing the conductors; and at least two outer conductive members, wherein each of the two outer conductive members has a first conductive portion that is disposed inside the respective opening and electrically connects to the partial portion of the corresponding conductor, and a second conductive portion that electrically connects to the first conductive portion and protrudes outwardly from the respective opening.

An LED package is provided and comprises:

an LED die that illuminates when excited, wherein the LED die has a light-emitting surface, a non-light-emitting surface opposite to the light-emitting surface, a first electrode, which acts as a first polarity, arranged on the non-light-emitting surface, and a second electrode, which acts as a second polarity that is opposite to the first polarity, arranged on the non-light-emitting surface;

a conductive member having a transparent conductive layer on the first electrode of the non-light-emitting surface of the LED die and an adjacent area near the first electrode;

an auxiliary LED die disposed on the transparent conductive layer, wherein the an auxiliary LED die includes a first surface, a second surface opposite to the first surface, a first auxiliary electrode disposed on the first surface, and a second auxiliary electrode arranged on the second surface; wherein the auxiliary LED die is disposed on the transparent conductive layer while the second surface of the auxiliary LED die is arranged under the non-light-emitting surface, and faces the non-light-emitting surface of the LED die, so that the second auxiliary electrode of the auxiliary LED die electrically connects to the first electrode of the LED die via the conductive layer;

an opaque enclosing layer formed on the non-light-emitting surface of the LED die for covering the auxiliary LED die, wherein the enclosing layer has two openings exposing the second electrode of the LED die and the first auxiliary electrode of the auxiliary LED die; and an outer conductive member arranged inside each of the openings; wherein the outer conductive member includes a first conductive portion that is disposed inside the respective opening and electrically connects to the partial portion of the conductive member, and a second conductive portion that electrically connects to the first conductive portion and protrudes outwardly from the respective opening.

An LED package is provided and comprises:

an LED die that illuminates when excited, wherein the LED die has a light-emitting surface, a non-light-emitting surface opposite to the light-emitting surface, a first electrode, which acts as a first polarity, arranged on the non-light-emitting surface, and a second electrode, which acts as a second polarity that is opposite to the first polarity, arranged on the non-light-emitting surface;

an auxiliary LED die disposed on the non-light-emitting surface of the LED die, wherein the auxiliary LED die has a first pole that is the first polarity and a second pole that is the second polarity;

a conductive member electrically connecting at least one of the electrodes of the LED die and a respective one of the poles of the auxiliary LED die, wherein the polarity of the respective pole of the auxiliary LED die is the same as that of the electrode of the LED die; and two outer conductive members electrically connecting the selected electrode or pole to an exterior circuit.

An LED package is provided and comprises:

an LED die that illuminates when excited, wherein the LED die has a light-emitting surface, a non-light-emitting surface opposite to the light-emitting surface, a first electrode, which acts as a first polarity, arranged on the light-emitting surface and the non-light-emitting surface in an alternative manner, and a second electrode, which acts as a second polarity that is opposite to the first polarity, arranged on the light-emitting surface and the non-light-emitting surface in an alternative manner;

an auxiliary LED die arranged on the non-light-emitting surface of the LED die, wherein the auxiliary LED die has a first pole area and a second pole area aligned with the first and the second electrodes of the LED die respectively; the first pole area acts as the first polarity and the second pole area acts as the second polarity, both the first and the second pole area have a through hole that exposes the respective electrode, whose polarity is the same as the pole area; and at least two outer conductive members electrically connecting the electrodes to an exterior circuit, wherein each of the outer conductive member has a first conductive portion that electrically connects with the respective electrode of the LED die and the respective pole area of the auxiliary LED die, and a second conductive portion that electrically connects to the first conductive portion and protrudes outwardly from the respective opening.

To provide a further understanding of the invention, the following detailed description illustrates embodiments and examples of the invention. Examples of the more important features of the invention have thus been summarized rather broadly in order that the detailed description thereof that follows may be better understood, and in order that the contributions to the art may be appreciated. There are, of course, additional features of the invention that will be described hereinafter which will form the subject of the claims appended hereto.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF THE EMBODIMENTS

Each number in these figures shows each identified member. To characterize the LED package in the present invention, the members shown in these figures are not drawn according to the real ratio.

Cross-sectional profiles in FIGS. 1 to 8 are shown as a first embodiment for making an LED of the present invention.

Figure 1:
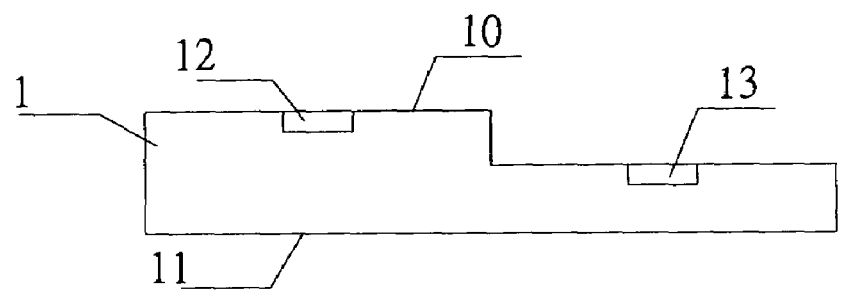
FIGS. 1 to 8 are cross-sectional profiles of a first embodiment for making the LED of the present invention.
Figure 2:
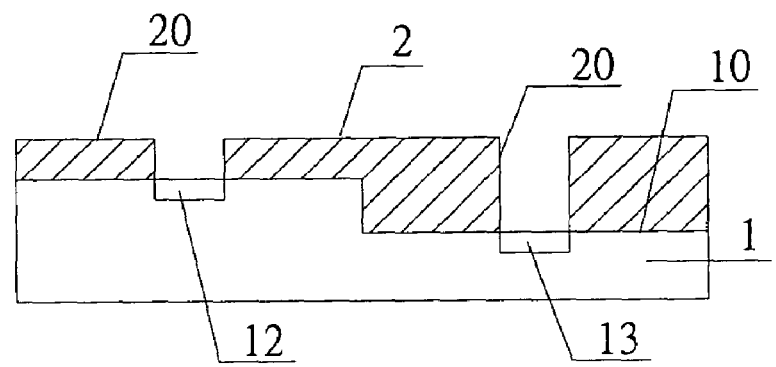

Referring to FIGS. 1 and 2, an LED die 1 is provided first that illuminates when it is excited. The LED die 1 has a light-emitting surface 11, a non-light-emitting surface 10 opposite to the light-emitting surface 11, a first electrode 12 and a second electrode 13 arranged on the non-light-emitting surface 10. The first electrode 12 is used as a first polarity, and the second electrode 13 is used as a second polarity that is opposite to the first polarity. Alternatively, an auxiliary conductive layer (not shown) can be formed on each of the electrodes 12 and 13 of the LED die 1. The auxiliary conductive layer is a metallic layer made of one or two materials, such as nickel, gold, or other metallic materials. Then, an opaque insulative layer 2, which is made of photosensitizing materials, is formed on the non-light-emitting surface 10 of the LED die 1.

Via an exposing and developing process, the insulative layer 2 is defined with two exposure holes 20 for exposing the two electrodes 12 and 13.

Figure 3:
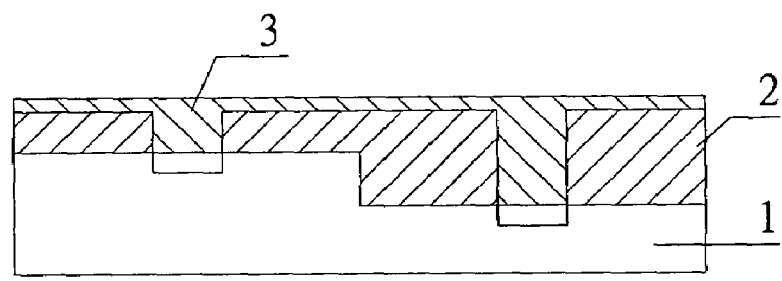

An opaque protective layer 3, which is made of photosensitizing materials, is formed on the opaque insulative layer 2 in FIG. 3.

Figure 4:
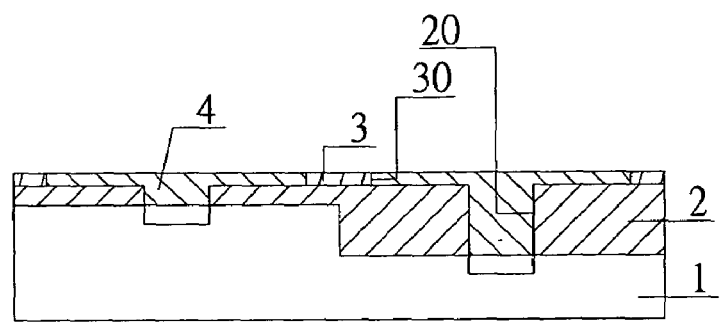

Via an exposing and developing process, the protective layer 3 is defined with two through holes 30 corresponding to the two exposure holes 20 one to one for communication, wherein each of the through holes 30 is larger than the respective exposure hole 20 in FIG. 4.

After forming the through holes 30, a conductor 4 is disposed inside each of the exposure holes 20 and the communicating through hole 30, so that the conductor 4 electrically connects to the respective electrode (12 or 13). The conductor 4 can be made of conductive paste by a printing method, other metallic materials by a sputtering method, or other suitable materials by any other method.

Alternatively, an auxiliary conductive layer (not shown) can be formed on the conductor 4.

Figure 5:
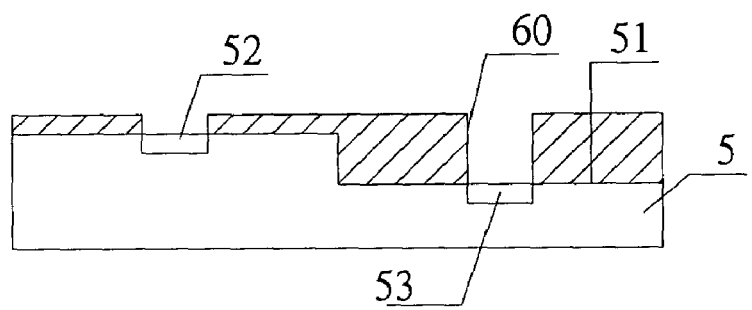

With respect to FIG. 5, a reverse-voltage protection member 5 is provided. In this embodiment, the reverse-voltage protection member 5 is an auxiliary LED die. The reverse-voltage protection member 5 has a first surface 50, whose area size is smaller than the area of the non-light-emitting surface 10 of the LED die 1, a second surface 51 opposite to the first surface 50, and a first auxiliary electrode 52 and a second auxiliary electrode 53 both arranged on the second surface 51. Alternatively, an auxiliary conductive layer (not shown) can be formed on the first auxiliary electrode 52 and the second auxiliary electrode 53. Then, an auxiliary opaque insulative layer 6, which is made of photosensitizing materials, is formed on the second surface 51 of the reverse-voltage protection member 5.

The first surface 50 can be a light-emitting surface, but the second surface 51 can be a non-light-emitting surface, or the arrangement can be reversed.

Via an exposing and developing process, the auxiliary opaque insulative layer 6 can be defined with two auxiliary exposure holes 60 for exposing the auxiliary electrodes 52 and 53 respectively.

Figure 6:
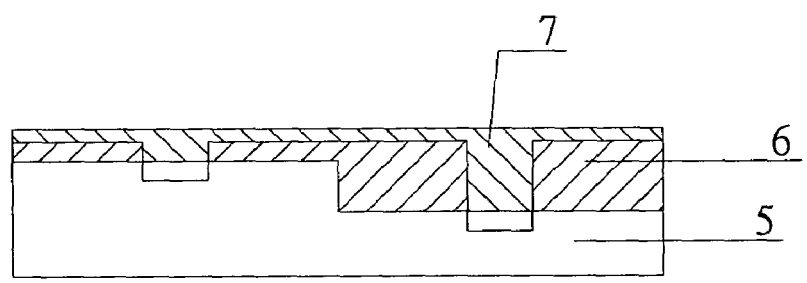

An auxiliary opaque protective layer 7, which is made of photosensitizing materials, is formed on the auxiliary opaque insulative layer 6 in FIG. 6.

Figure 7:
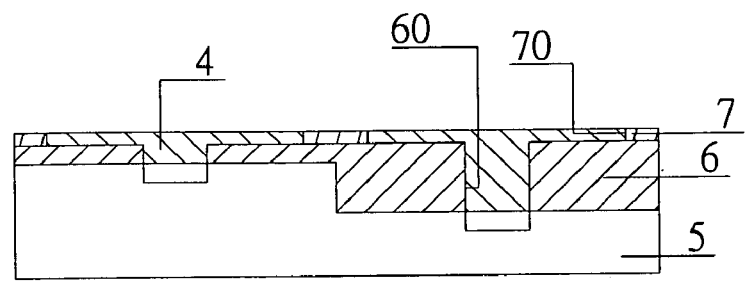
Figure 8:
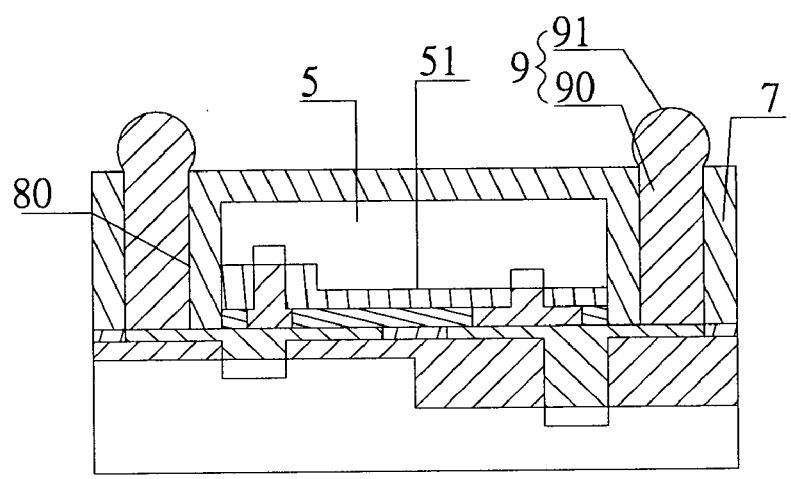

Via an exposing and developing process, the auxiliary opaque protective layer 7 is defined with two auxiliary through holes 70 corresponding to the two auxiliary exposure holes 60 one to one for communication, wherein each of the auxiliary through holes 70 is larger than the respective auxiliary exposure hole 60 in FIG. 7.

After forming the auxiliary through holes 70, another conductor 4 is disposed inside each of the auxiliary exposure holes 60 and the communicating auxiliary through hole 70, so that the conductor 4 electrically connects to the respective auxiliary electrode (52 or 53). The conductor 4 can be made of conductive paste by a printing method, other metallic materials by a sputtering method, or other suitable materials by any other method. These conductors 4 in the LED die 1 and the auxiliary LED die 5 can be treated as a conductive member.

Alternatively, an auxiliary conductive layer (not shown) can be formed on the conductor 4 that connects the respective electrode (52 or 53) of the reverse-voltage protection member 5.

The first electrode 12 of the LED die 1 electrically connects to the second auxiliary electrode 53 of the auxiliary LED die 5 via the respective conductor 4, and the second electrode 13 of the LED die 1 electrically connects to the first auxiliary electrode 52 of the auxiliary LED die 5 via the other conductor 4, while the second surface 51 of the reverse-voltage protection member 5 is arranged under the non-light-emitting surface 10, and faces the non-light-emitting surface 10, and is disposed on the protective layer 3 of the LED die 1. Thereafter, an opaque enclosing layer 8, which is made of photosensitizing materials, is formed over the opaque protective layer 3 of the LED die 1 to cover the auxiliary LED die 5. Via an exposing and developing process, the opaque enclosing layer 8 has two openings 80 corresponding to the through holes 30 of the opaque protective layer 3 of the LED die 1 respectively for exposing a partial portion of the conductors 4.

After the openings 80 are formed, two outer conductive members 9 are arranged. Each of the two outer conductive members 9 includes a first conductive portion 90 that is disposed inside the respective opening 80 and electrically connects to the partial portion of the corresponding conductor 4, and a second conductive portion 91 that electrically connects to the first conductive portion 90 and protrudes outwardly from the respective opening 80 for electrically connecting to an exterior circuit (not shown).

The two outer conductive members 9 can be made of any suitable material; the first and second conductive portion 90 and 91 can be made by the same materials or different materials.

In this embodiment, the insulative layers 2 and 6, the protective layers 3 and 7, and the enclosing layer 8 are made of opaque photosensitizing materials, so that light from the reverse-voltage protection member 5 will not, over a short period of time, interfere with light from the LED die 1 when the reverse-voltage protection member 5 is operating. Furthermore, a Zener diode can be replaced with the auxiliary LED die 5 for protection.

When the Zener diode is used, the insulative layers 2 and 6, the protective layers 3 and 7, and the enclosing layer 8 will not be retrained by opaque photosensitizing materials because the Zener diode cannot illuminate while it is in use.

By controlling the size of the opening 80, the size of the outer conductive member 9 can be adjusted for electrically connecting with other devices. For example, the second conductive member 91 of the outer conductive member 9 is larger than the electrode of the LED die 1, shown in FIG. 25.

When the first electrode 12 of the LED die 1 electrically connects to the first auxiliary second electrode 52 of the auxiliary LED die 5, the second electrode 13 of the LED die 1 electrically connects to the second auxiliary second electrode 53 of the auxiliary LED die 5.

The insulative layers 2 and 6, the protective layers 3 and 7, and the enclosing layer 8 are made of transparent photosensitizing materials. The non-light-emitting surface 10 of the LED die 1 allows light to pass through. The LED package of the present invention can be an LED with improved illumination or an LED with mixed light. The mixed light originates in different proportions from the LED die 1 and the auxiliary LED die 5.

That means that the same color light from the LED die 1 and from the auxiliary LED die 5 makes a light with the same color in order to improve the illumination of the LED package. Alternatively, a different colored light of the LED die 1 and the auxiliary LED die 5 mixes the two lights to form another color, so as to get white light or colored light.

Cross-sectional profiles in FIGS. 9 to 12 are shown as a second embodiment for making an LED of the present invention.

Figure 9:
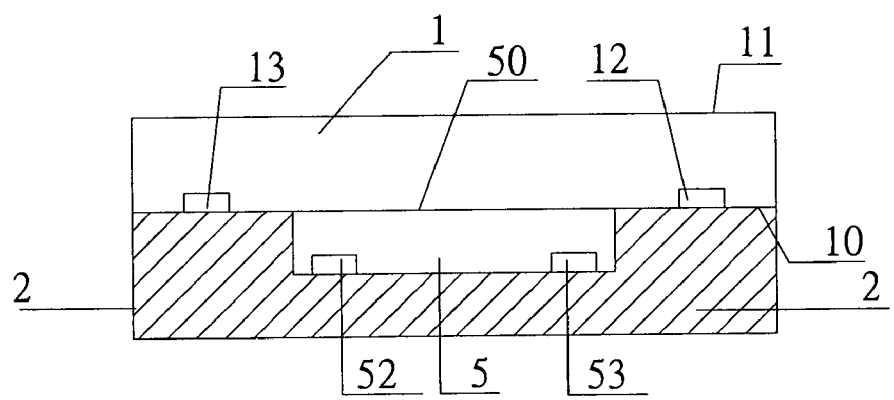
FIGS. 9 to 12 are cross-sectional profiles of a second embodiment for making the LED of the present invention.
Figure 10:
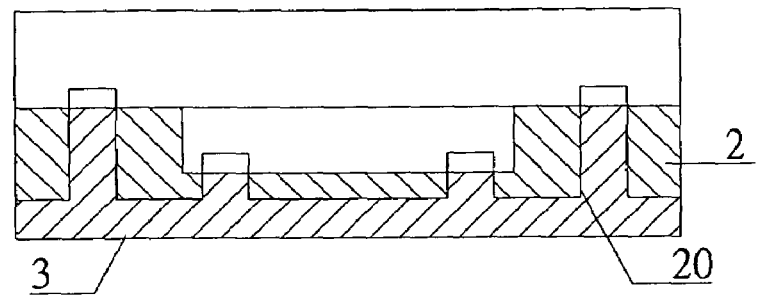

Referring to FIG. 9, an LED die 1 is provided first and illuminates when it is excited. The LED die 1 has a light-emitting surface 11, a non-light-emitting surface 10 opposite to the light-emitting surface 11, a first electrode 12 and a second electrode 13 arranged on the non-light-emitting surface 10. The first electrode 12 is used as a first polarity, and the second electrode 13 is used as a second polarity that is opposite to the first polarity. Alternatively, an auxiliary conductive layer (not shown) can be formed on each of the electrodes 12 and 13 of the LED die 1.

A reverse-voltage protection member 5 is provided. In this embodiment, the reverse-voltage protection member 5 is an auxiliary LED die. The reverse-voltage protection member 5 which has a first surface 50, whose area size is smaller than that of the non-light-emitting surface 10 of the LED die 1, a second surface 51 opposite to the first surface 50, and a first auxiliary electrode 52 and a second auxiliary electrode 53 both arranged on the second surface 51. Alternatively, an auxiliary conductive layer (not shown) can be formed on the first auxiliary electrode 52 and the second auxiliary electrode 53.

After the step of the first surface 50 of the reverse-voltage protection member 5 being disposed facing the non-light-emitting surface 10 of the LED die 1 and on top of the non-light-emitting surface 10 of the LED die 1, an insulative layer 2 can be formed on the non-light-emitting surface 10 of the LED die 1 for covering the reverse-voltage protection member 5. Via an exposing and developing process, the insulative layer 2 is defined with a plurality of exposure holes 20 for exposing the electrodes 12 and 13, 52, and 53, shown in FIG. 10.

Figure 11:
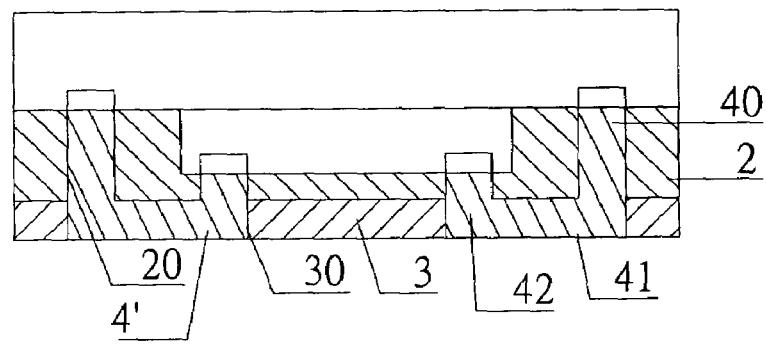
Figure 12:
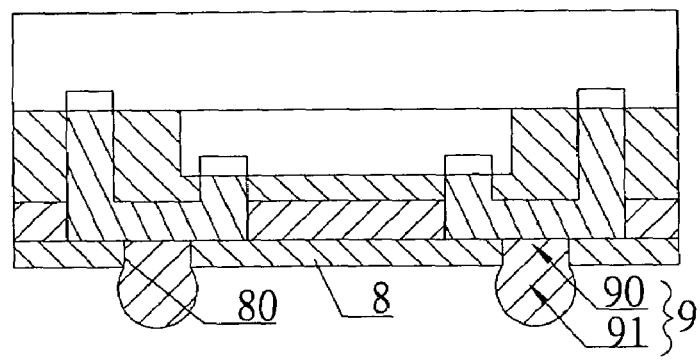

A protective layer 3, which is made of opaque photosensitizing materials, is formed on the insulative layer 2 in FIG. 3. Via an exposing and developing process, the protective layer 3 is defined with two through holes 30 corresponding to the two respective exposure holes 20 for electrically connecting two electrodes, one electrode acts as an LED die 1, the other electrode acts as the auxiliary LED die 5 and has polarity opposite to that of the other one as shown in FIG. 11. Two conductors 4' are conductive members that can be made of other suitable materials by any other method. Each conductor 4' includes a first portion 40 that is disposed inside the respective exposure hole 20 to electrically connect with the respective electrode (12 and 13) of the LED die, a second portion 41 that is disposed inside the respective through hole 30 communicates with the exposure hole 20 of the insulative layer 2 receiving the first portion 40 to electrically connect with the first portion 40, and a third portion 42 that is disposed inside the respective exposure hole 20 communicates with the through hole 30 receiving the second portion 41 in order to electrically connect with the respective auxiliary electrode (52 and 53) of the auxiliary LED die 5 and the second portion 41.

Alternatively, an auxiliary conductive layer (not shown) can be formed on the second portion 41 of the conductor 4'.

An enclosing layer 8 is formed over the protective layer 3 of the LED die 1. Via an exposing and developing process, the enclosing layer 8 has two openings 80 for exposing a partial portion of the second portion 41 of the conductor 4'.

After the openings 80 are formed, two outer conductive members 9 are arranged. Each of the two outer conductive members 9 includes a first conductive portion 90 that is disposed inside the respective opening 80 and electrically connects to the partial portion of the second portion 41 of the corresponding conductor 4', and a second conductive portion 91 that electrically connects to the first conductive portion 90 and protrudes outwardly from the respective opening 80.

In this embodiment, a Zener diode can be replaced with the auxiliary LED die 5 for protection. In another embodiment, the LED package of the present invention can be an LED with improved illumination or an LED with mixed light. The mixed light originates in different proportions from the LED die 1 and the auxiliary LED die 5. The reasons for this are the same as the prior embodiment and no further descriptions are provided.

Figure 13:
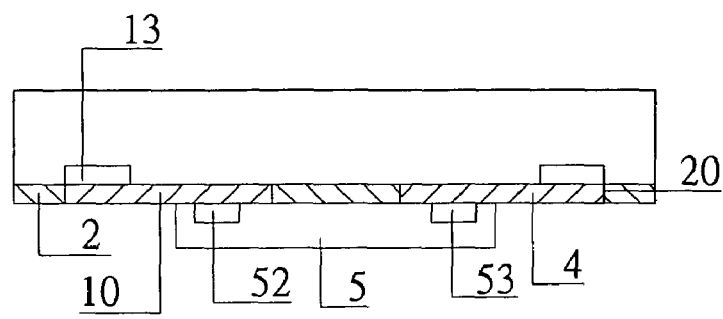
FIGS. 13 to 15 are cross-sectional profiles of a third embodiment for making the LED of the present invention.
Figure 14:
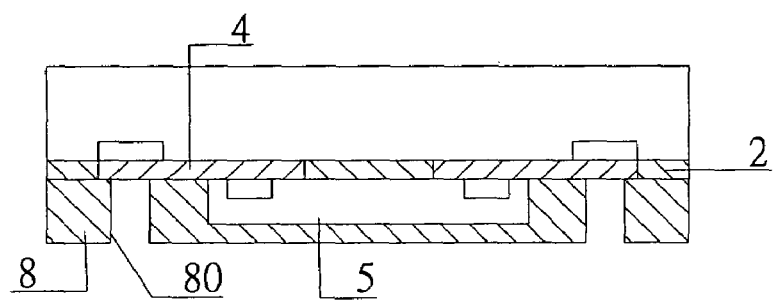
Figure 15:
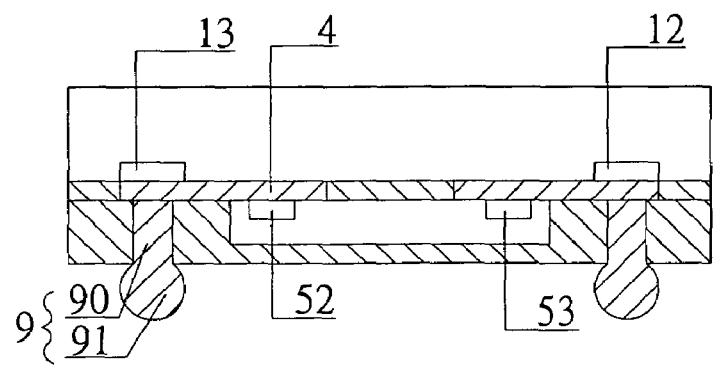

Cross-sectional profiles in FIGS. 13 to 15 are shown as a third embodiment for making the LED of the present invention.

Referring to FIG. 13, an LED die 1, the same as in the prior embodiment, is provided. An insulative layer 2 is formed on the non-light-emitting surface 10 of the LED die 1. Via an exposing and developing process, the insulative layer 2 is defined with two exposure holes 20 for exposing the two electrodes 12 and 13. Each exposure hole 20 is larger than each of the electrodes 11 and 12.

A conductor 4 is disposed inside each of the exposure holes 20 so as to electrically connect with the respective electrode (12 or 13). The conductor 4 can be treated as a conductive member, just the same as in the prior embodiment. The conductor 4 can be made of conductive paste by a printing method, other metallic materials by a sputtering method, or other suitable materials by any other method. Alternatively, an auxiliary conductive layer (not shown) can be formed on the conductor 4.

A reverse-voltage protection member 5, the same as in the second embodiment, is provided. The second electrode 13 of the LED die 1 electrically connects to the first auxiliary electrode 52 of the auxiliary LED die via the respective conductor 4, and the first electrode 12 of the LED die 1 electrically connects to the second auxiliary electrode 53 of the auxiliary LED die 5 via the other conductor 4, while the second surface 51 of the reverse-voltage protection member 5 is arranged under the non-light-emitting surface 10, and faces the non-light-emitting surface 10, and is disposed on the insulation layer 2 of the LED die 1

With respect to FIG. 14, after the auxiliary LED die 5 is disposed, an enclosing layer 8 is formed over the insulation layer 2 of the LED die 1 to cover the auxiliary LED die 5. Via an exposing and developing process, the opaque enclosing layer 8 has two openings 80 for exposing a partial portion of the conductors 4.

After the openings 80 are formed, two outer conductive members 9 are arranged in FIG. 15. Each of the two outer conductive members 9 includes a first conductive portion 90 that is disposed inside the respective opening 80 and electrically connects to the partial portion of the corresponding conductor 4, and a second conductive portion 91 that electrically connects to the first conductive portion 90 and protrudes outwardly from the respective opening 80.

In this embodiment, a Zener diode can be replaced with the auxiliary LED die 5 for protection. In another embodiment, the LED package of the present invention can be an LED with improved illumination or an LED with mixed light. The mixed light originates in different proportions from the LED die 1 and the auxiliary LED die 5. The reasons for this are the same as the prior embodiment and no further descriptions are provided.

Cross-sectional profiles in FIGS. 16 to 19 are shown as a fourth embodiment for making an LED of the present invention.

Figure 16:
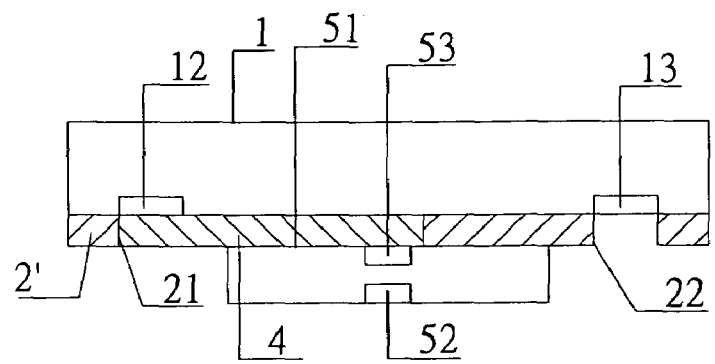
FIGS. 16 to 19 are cross-sectional profiles of a fourth embodiment for making the LED of the present invention.

Referring to FIG. 16, an LED die 1, the same as in the prior embodiment, is provided.

An insulative layer 2, which is made of opaque photosensitizing materials, is formed on the non-light-emitting surface 10 of the LED die 1. Via an exposing and developing process, the insulative layer 2 is defined with a first exposure hole 21 exposing the first electrode 12 and a second exposure hole 22 exposing the second electrode 13, the first exposure hole 21 is larger than each of the electrodes 11 and 12.

A conductor 4 is formed inside the first exposure hole 21 of the insulative layer 2 in order to electrically connect with the first electrode 12 of the LED die 1. The conductor 4 can be made of conductive paste by a printing method, other metallic materials by a sputtering method, or other suitable materials by any other method. Alternatively, an auxiliary conductive layer (not shown) can be formed on the conductor 4.

A reverse-voltage protection member 5 is provided; in this embodiment, the reverse-voltage protection member 5 is an auxiliary LED die. The auxiliary LED die 5 includes a first surface 50, a second surface 51 opposite to the first surface 50, a first auxiliary electrode 52 disposed on the first surface 50, and a second auxiliary electrode 53 arranged on the second surface 51. The second auxiliary electrode 53 of the auxiliary LED die 5 is electrically connected with the first electrode 13 of the LED die 1 via a respective one of the conductors 4, while the second surface 51 of the auxiliary LED die 5 is arranged under the non-light-emitting surface 10, and faces the non-light-emitting surface 10 of the LED die 1.

Figure 17:
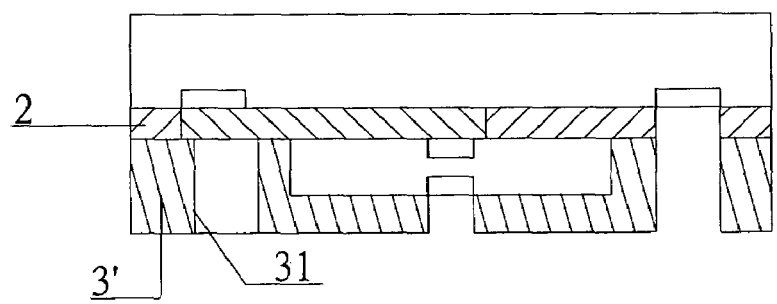
Figure 18:
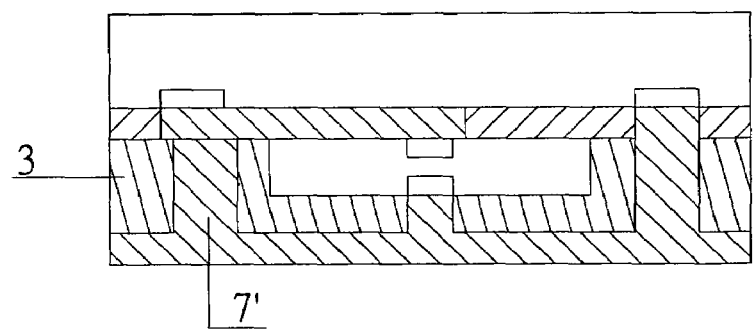
Figure 19:
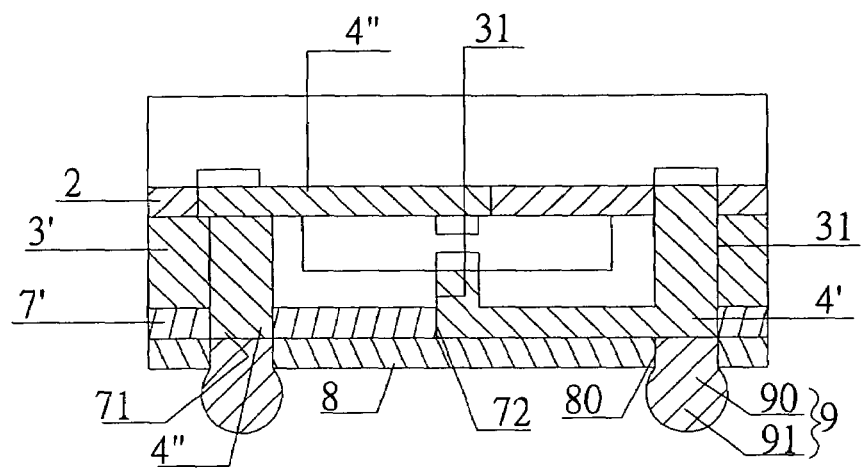

An opaque first protective layer 3', which is made of photosensitizing materials, is formed on the insulative layer 2 in FIG. 17. The opaque first protective layer 3' has three auxiliary through holes 31 exposing the first auxiliary electrode 52 of the auxiliary LED die 5, the second electrode 13 of the LED die 1, and the partial portion of the conductor 4 respectively.

An opaque second protective layer 7', which is made of photosensitizing materials, is formed on the opaque first protective layer 3'.

Via an exposing and developing process, the opaque second protection is defined with a first through hole 71 corresponding to the a respective one of the auxiliary through holes 31, which reveals the partial portion of the conductor 4, in order to electrically connect with the partial portion of the conductor 4; and a second through hole 72 communicating with the other auxiliary through holes 31.

A conductor 4" is disposed inside a respective one of the auxiliary through holes 31 of the first protective layer 3 and the first through hole 71 of the second protective layer 7 in order to electrically connect with the partial portion of the conductor 4", and another conductor 4" is disposed inside the other auxiliary through holes 31 of the first protective layer 3 and the second through hole 72 of the second protective layer 7 for the second electrode 13 of the LED die 1 electrically connecting the first auxiliary electrode 52 of the auxiliary LED die 5. The conductors 4 and 4" are treated as a conductive member.

An opaque enclosing layer 8, which is made of photosensitizing materials, is formed over the second protective layer 7, wherein the opaque enclosing layer 8 has two openings 80 communicating with the respective first and the second through holes 71 and 72 for exposing the respective conductors 4 and 4".

Each of the two outer conductive members 9 includes a first conductive portion 90 that is disposed inside the respective opening 80 and electrically connects to the respective conductor 4 and 4" and a second conductive portion 91 that electrically connects to the first conductive portion 90 and protrudes outwardly from the respective opening 80.

In this embodiment, the auxiliary LED die 5 can be replaced by a Zenar diode in order to protect the LED. In another embodiment, the LED package of the present invention can be an LED with improved illumination or an LED with mixed light. The mixed light originates in different proportions from the LED die 1 and the auxiliary LED die 5. The reasons for this are the same as the prior embodiment and no further descriptions are provided.

Figure 20:
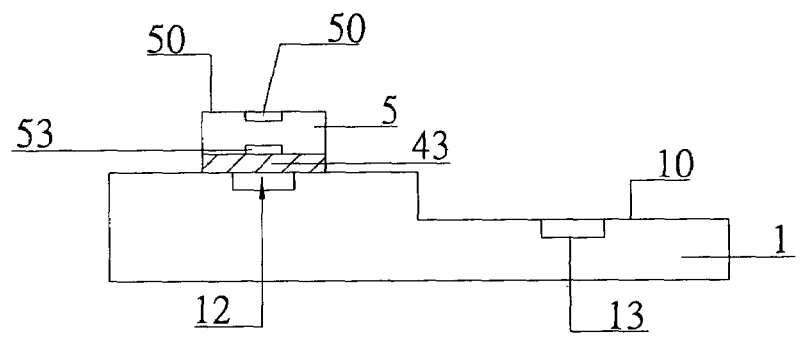
FIGS. 20 to 21 are cross-sectional profiles of a fifth embodiment for making the LED of the present invention.
Figure 21:
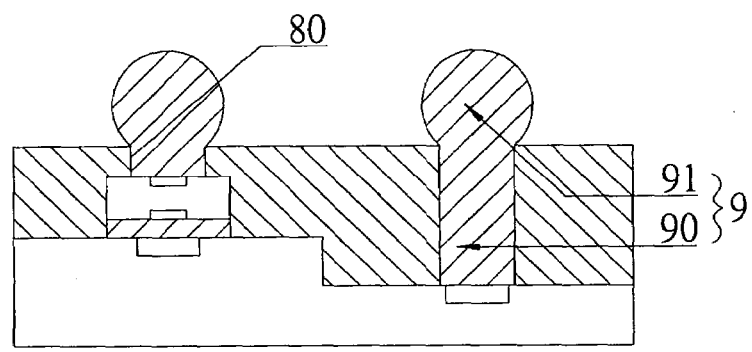

Cross-sectional profiles in FIGS. 20 to 21 are shown as a fifth embodiment for making the LED of the present invention.

Referring to FIG. 20, an LED die 1, the same as the prior embodiment, is provided.

A transparent conductive layer 43, treated as a conductive member, is formed on the first electrode 12 of the non-light-emitting surface 10 of the LED die 1 and an adjacent area near the first electrode 12, such as ITO layer.

An auxiliary LED die 5 is disposed on the transparent conductive layer 43, and includes a first surface 50, a second surface 51 opposite to the first surface 50, a first auxiliary electrode 52 disposed on the first surface 50, and a second auxiliary electrode 53 arranged on the second surface 51. The second surface 51 of the auxiliary LED die 5 is arranged under the non-light-emitting surface 10, and faces the non-light-emitting surface 10 of the LED die 1, and is disposed on the transparent conductive layer 43, so that the second auxiliary electrode 53 of the auxiliary LED die 5 electrically connects to the first electrode 12 of the LED die 1 via the conductive layer 43.

An opaque enclosing layer 80, which is made of photosensitizing materials, is formed over the non-light-emitting surface 10 of the LED die 1 to cover the auxiliary LED die 5 in FIG. 21. Via an exposing and developing process, the enclosing layer 8 has two openings 80 exposing the second electrode 13 of the LED die 1 and the first auxiliary electrode 52 of the auxiliary LED die 5.

Each of the two outer conductive members 9 includes a first conductive portion 90 that is disposed inside the respective opening 80 and electrically connects to electrodes 13 and 52 connected thereto, and a second conductive portion 91 that electrically connects to the first conductive portion 90 and protrudes outwardly from the respective opening 80.

Figure 22:
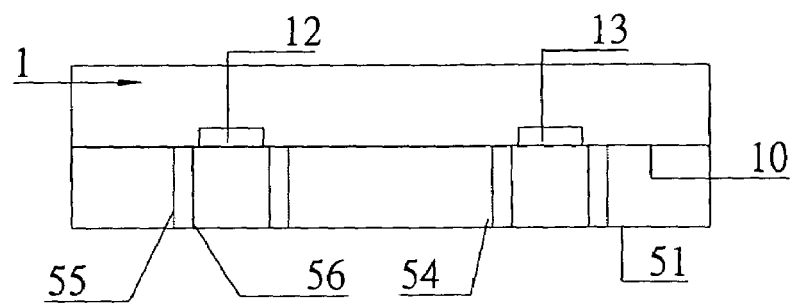
FIGS. 22 to 25 are cross-sectional profiles of a sixth embodiment for making the LED of the present invention.
Figure 23:
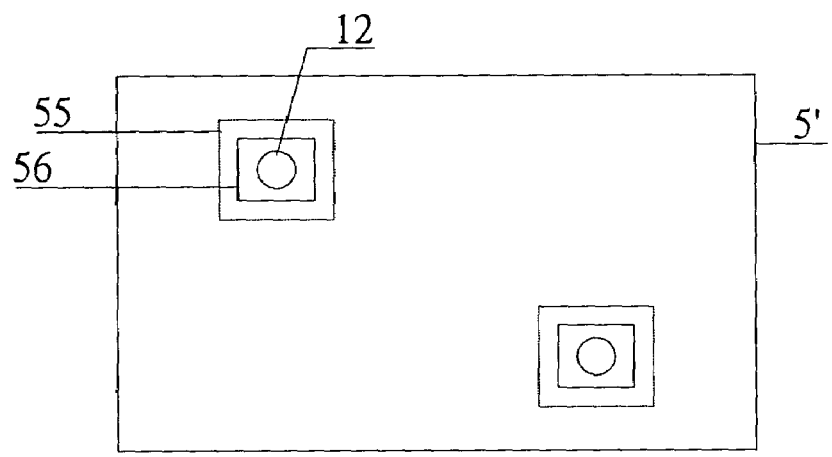

Cross-sectional profiles in FIGS. 22 to 25 are shown as a sixth embodiment for making an LED of the present invention. FIG. 23 is a bottom view of FIG. 22.

Referring to FIGS. 22 and 23, an LED die 1, the same as the prior embodiment, is provided.

A reverse-voltage protection member 5' is provided on the non-light-emitting surface 10 of the LED die 1; in this embodiment, the reverse-voltage protection member 5' is an auxiliary LED die, including a first pole area 54 and a second pole area 55 aligned with the first and the second electrodes 12 and 13 of the LED die 1 respectively. The first pole area 54 acts as the first polarity and the second pole area 55 acts as the second polarity; both the first and the second pole area 54 and 55 have a through hole 56 that exposes the respective electrode 13 or 12, whose polarity is opposite to the pole areas 54 and 55.

Figure 24:
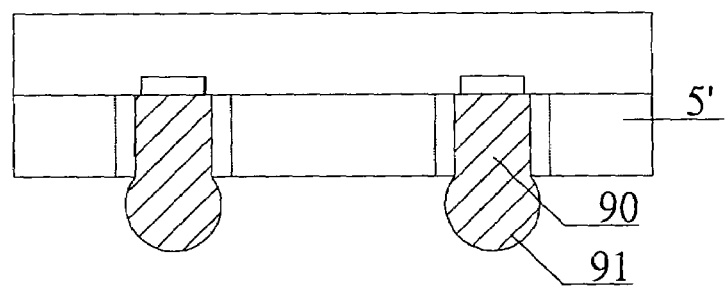
Figure 25:
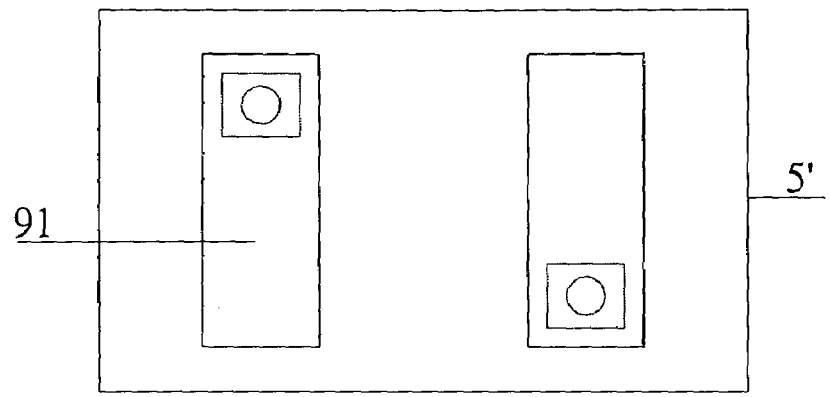

With respect to FIGS. 24 and 25, each of the two outer conductive members 9 includes a first conductive portion 90 that is disposed inside the respective through hole 56 and electrically connects to the respective electrode 12 or 13 of the LED die 1, and a second conductive portion 91 that electrically connects to the first conductive portion 90 and protrudes outwardly from the respective through hole 56 for electrically connecting to an exterior circuit (not shown). Because the first conductive member 90 is disposed inside the through hole 56 of the reverse-voltage protection member 5', the first pole area 54 of the reverse-voltage protection member 5' electrically connects to the second electrode 13 of the LED die 1, and the second pole area 55 of the reverse-voltage protection member 5' electrically connects to the first electrode 12 of the LED die 1.

In this embodiment, a Zener diode can be replaced with the auxiliary LED die 5 for protection. In another embodiment, the LED package of the present invention can be an LED with improved illumination or an LED with mixed light. The mixed light originates in different proportions from the LED die 1 and the auxiliary LED die 5. The reasons for this are the same as the prior embodiment and no further descriptions are provided.

Cross-sectional profiles in FIGS. 26 to 30 are shown as a seventh embodiment for making an LED of the present invention.

Figure 26:
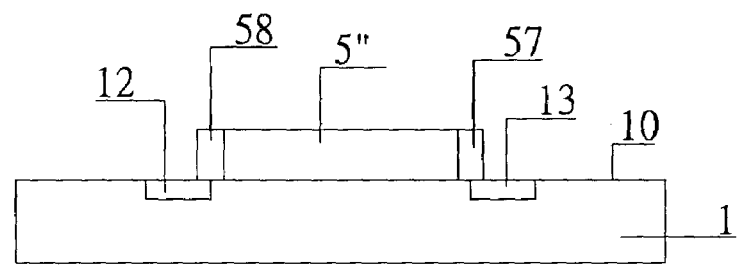
FIGS. 26 to 30 are cross-sectional profiles of a seventh embodiment for making the LED of the present invention.

Referring to FIG. 26, an LED die 1, the same as the prior embodiment, is provided.

A reverse-voltage protection member 5" is provided on the non-light-emitting surface 10 of the LED die 1. In this embodiment, the reverse-voltage protection member 5" is a capacitor, which includes two poles 57 and 58 extending around the electrodes 13 or 12 of the LED die respectively, and being opposite to each other.

Figure 27:
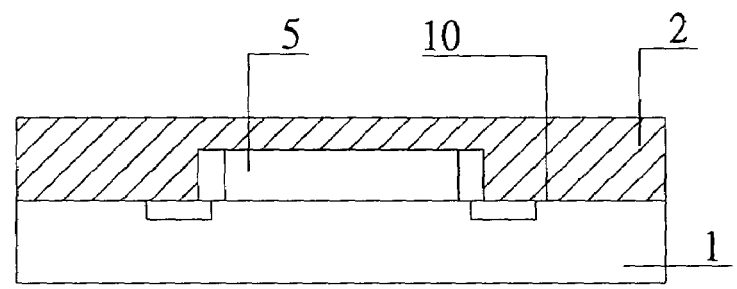
Figure 28:
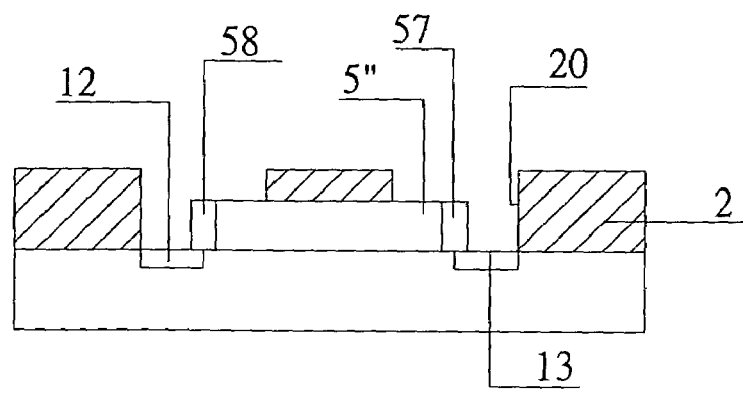

With respect to FIGS. 27 and 28, an insulative layer 2 is formed on an electrode installation surface, which is the non-light-emitting surface 10, of the LED die 1 to cover the reverse-voltage protection member 5". Via an exposing and developing process, the insulative layer 2 is defined with two exposure holes 20 exposing a respective one of the electrodes 12 or 13 of the LED die 1 and the respective poles 57 or 58 of the reverse-voltage protection member 5" extending around the electrode of the LED die 1, respectively.

Figure 29:
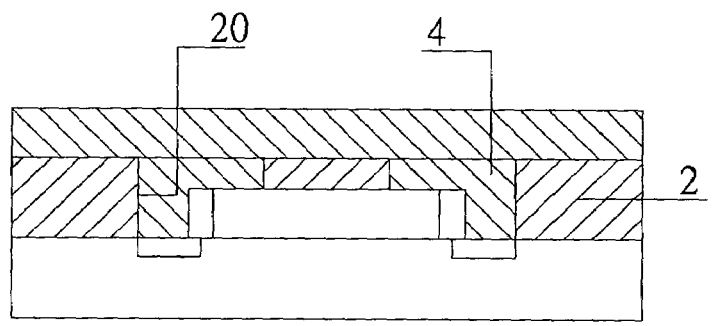

Referring to FIG. 29, a conductive member includes two conductors 4, each of the two conductors 4 are disposed inside the respective exposure holes 20 for electrically connecting the respective electrodes 12 and 13 of the LED die to the respective poles 58 or 57 of the reverse-voltage protection member 5".

Figure 30:
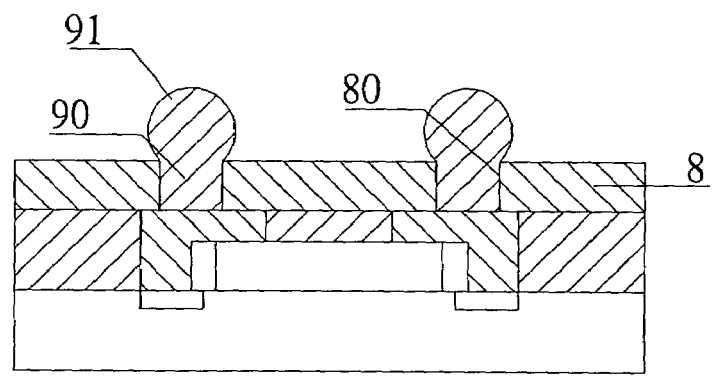

An enclosing layer 8 is formed over the insulation layer 2 of the LED die 1, and has two openings 80 for exposing the conductors 4 after exposure and developing steps that can be seen in FIG. 30

After the openings 80 are formed, two outer conductive members 9 are arranged. Each of the two outer conductive members 9 includes a first conductive portion 90 that is disposed inside the respective opening 80 and electrically connects to the partial portion of the corresponding conductor 4; and a second conductive portion 91 that electrically connects to the first conductive portion 90 and protrudes outwardly from the respective opening 80.

The capacitor is properly provided in the first to fourth, and sixth embodiments.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An LED package, comprising:
   an LED die that illuminates when excited, wherein the LED die has a light-emitting surface, a non-light-emitting surface opposite to the light-emitting surface, a first electrode, which acts as a first polarity, arranged on the light-emitting surface and the non-light-emitting surface in an alternative manner, and a second electrode, which acts as a second polarity that is opposite to the first polarity, arranged on the light-emitting surface and the non-light-emitting surface in an alternative manner;
   a reverse-voltage protection member arranged on the non-light-emitting surface of the LED die, wherein the reverse-voltage protection member has a first pole that is the first polarity and a second pole that is the second polarity;
   two inner conductive members electrically connecting a respective one of the electrodes of the LED die to a respective one of the poles of the reverse-voltage protection member, wherein the polarity of each pole of the reverse-voltage protection member is opposite to that of the respective electrode of the LED die;
   an enclosing layer covering the inner conductive members and enclosing the reverse-voltage protection member; and two outer conductive members respectively and electrically connecting the inner conductive members to an exterior circuit and extending from the respective inner conductive members through the enclosing layer for connecting with the exterior circuit.

2. The LED package as claimed in claim 1, wherein the outer conductive members, the enclosing layer, and the reverse-voltage protection member are disposed at the same side of the LED die opposite to the light-emitting surface of the LED die.

3. The LED package as claimed in claim 1, further comprising an insulative layer formed on the non-light emitting surface of the LED die, and a protective layer formed on the insulative layer; wherein the first and second electrodes of the LED die are arranged on the non-light-emitting surface of the LED die, the insulative layer has two exposure holes exposing the first and second electrodes of the LED die, respectively, and the protective layer has two through holes registered and in spatial communication with the two exposure holes, the inner conductive members filling the through holes in the protective layer and the exposure holes in the insulative layer.

4. The LED package as claimed in claim 3, wherein each of the through holes in the protective member is larger than the respective exposure hole in the insulative layer.

5. The LED package as claimed in claim 3, wherein the reverse-voltage protection member is an auxiliary LED die.

6. The LED package as claimed in claim 5, wherein the auxiliary LED die has a first surface, a second surface opposite to the first surface, and first and second auxiliary electrodes arranged on the second surface, the LED package further comprising an auxiliary insulative layer formed on the second surface of the auxiliary LED die, and an auxiliary protective layer formed on the auxiliary insulative layer, the auxiliary insulative layer having two auxiliary exposure holes exposing the first and second auxiliary electrodes, respectively, the auxiliary protective layer having two auxiliary through holes registered and in spatial communication with the two auxiliary exposure holes, the LED package further comprising two auxiliary conductive members filling the auxiliary exposure holes and the auxiliary through holes and in electrical contact with the inner conductive members, respectively.

7. The LED package as claimed in claim 6, wherein each of the auxiliary through holes is larger than the respective auxiliary exposure hole.

8. An LED package, comprising:
an LED die that illuminates when excited, wherein the LED die has a light-emitting surface, a non-light-emitting surface opposite to the light-emitting surface, a first electrode, which acts as a first polarity, arranged on the light-emitting surface and the non-light-emitting surface in an alternative manner, and a second electrode, which acts as a second polarity that is opposite to the first polarity, arranged on the light-emitting surface and the non-light-emitting surface in an alternative manner;
a reverse-voltage protection member arranged on the non-light-emitting surface of the LED die, wherein the reverse-voltage protection member has a first pole that is the first polarity and a second pole that is the second polarity;
a conductive member electrically connecting at least one of the electrodes of the LED die and a respective one of the poles of the reverse-voltage protection member, wherein the polarity of each pole of the reverse-voltage protection member is opposite to that of the electrode of the LED die;
two outer conductive members electrically connecting the selected electrode or pole to an exterior circuit;
an opaque insulative layer formed on the non-light-emitting surface of the LED die;
an opaque protective layer formed on the opaque insulative layer, wherein the first and second electrode are arranged on the non-light-emitting surface of the LED die, the opaque insulative layer has two exposure holes exposing the electrodes respectively, and the opaque protective layer has two through holes corresponding to the two exposure holes one to one for communication, wherein each of the through holes is larger than the respective exposure hole;
an auxiliary opaque insulative layer formed on a second surface of the reverse-voltage protection member;
an auxiliary opaque protective layer formed on the auxiliary opaque insulative layer, wherein the reverse-voltage protection member has an auxiliary LED die including a first surface, the second surface opposite to the first surface, and a first and a second auxiliary electrode arranged on the second surface, wherein the auxiliary opaque insulative layer has two auxiliary exposure holes exposing the auxiliary electrodes respectively, and the auxiliary opaque protective layer has two auxiliary through holes corresponding to the two auxiliary exposure holes one to one for communication, each of the auxiliary through holes is larger than the respective auxiliary exposure hole, the auxiliary LED die is disposed on the opaque protective layer of the LED die while the second surface of the auxiliary LED die is arranged under the non-light-emitting surface, and faces the non-light-emitting surface of the LED die, the through hole of the LED die of the LED die is larger than the auxiliary through hole of the auxiliary LED die, wherein the conductive member has a plurality of conductors inside a respective one of the through holes and the corresponding exposure hole in order to electrically connect to the respective electrode, the first electrode of the LED die electrically connects with the second auxiliary electrode of the auxiliary LED die via a respective one of the conductors but the second electrode of the LED die electrically connects with the first auxiliary electrode of the auxiliary LED die via a respective one of the conductors, while the auxiliary LED die is disposed on the opaque protective layer of the LED die; and
an opaque enclosing layer formed over the opaque protective layer of the LED die, wherein the opaque enclosing layer covers the auxiliary LED die and has two openings corresponding to the through holes of the opaque protective layer of the LED die respectively for exposing a partial portion of the conductors formed inside the through holes respectively, each outer conductive member includes a first conductive portion that is disposed inside the respective opening and electrically connects to the partial portion of the corresponding conductor, and a second conductive portion that electrically connects to the first conductive portion and protrudes outwardly from the respective opening.

9. An LED package, comprising:
an LED die that illuminates when excited, wherein the LED die has a light-emitting surface, a non-light-emitting surface opposite to the light-emitting surface, a first electrode, which acts as a first polarity, arranged on the non-light-emitting surface, and a second electrode, which acts as a second polarity that is opposite to the first polarity, arranged on the non-light-emitting surface;

an auxiliary LED die disposed on the non-light-emitting surface of the LED die, wherein the auxiliary LED die has a first pole that is the first polarity and a second pole that is the second polarity;

a conductive member electrically connecting at least one of the electrodes of the LED die and a respective one of the poles of the auxiliary LED die, wherein the polarity of the respective pole of the auxiliary LED die is the same as that of the electrode of the LED die; and two outer conductive members electrically connecting the selected electrode or pole to an exterior circuit.

10. The LED package as claimed in claim 9, further including an insulative layer formed on the LED die and an protective layer formed on the insulative layer, wherein the insulative layer has two exposure holes exposing the electrodes respectively, and the protective layer has two through holes corresponding to the two exposure holes one to one for communication, wherein each of the through holes is larger than the respective exposure hole;

further including an auxiliary insulative layer on a second surface of the auxiliary LED die and an auxiliary protective layer on the auxiliary insulative layer, wherein the auxiliary LED die includes a first surface, the second surface opposite to the first surface, and a first and a second auxiliary electrode arranged on the second surface; wherein the auxiliary insulative layer has two auxiliary exposure holes exposing the auxiliary electrodes respectively, and the auxiliary protective layer has two auxiliary through holes corresponding to the two auxiliary exposure holes one to one for communication; each of the auxiliary through holes is larger than the respective auxiliary exposure hole; wherein the auxiliary LED die is disposed on the protective layer of the LED die while the second surface of the auxiliary LED die is arranged under the non-light-emitting surface, and faces the non-light-emitting surface of the LED die; the through hole of the LED die is larger than the auxiliary through hole;

wherein the conductive member includes a plurality of conductors inside a respective one of the respective through holes and a respective one of the exposure holes in order to electrically connect to the respective electrodes; the first electrode of the LED die electrically connects with the first auxiliary electrode of the auxiliary LED die via the corresponding conductor but the second electrode of the LED die electrically connects with the second auxiliary electrode of the auxiliary LED die via the corresponding conductor, while the auxiliary LED die is disposed on the protective layer of the LED die;

further including an opaque enclosing layer formed over the protective layer of the LED die, wherein the opaque enclosing layer covers the auxiliary LED die and has two openings corresponding to the through holes of the protective layer of the LED die respectively for exposing a partial portion of the conductors formed inside the through holes respectively; and wherein each of the two outer conductive member includes a first conductive portion that is disposed inside the respective opening and electrically connects to the partial portion of the corresponding conductor, and a second conductive portion that electrically connects to the first conductive portion and protrudes outwardly from the respective opening.

* * * * *